US005514988A

United States Patent [19]
Schrader et al.

[11] Patent Number: 5,514,988
[45] Date of Patent: May 7, 1996

[54] TEMPERATURE-COMPENSATED, PRECISION FREQUENCY-TO-VOLTAGE CONVERTER

[75] Inventors: Victor P. Schrader, Palo Alto; Steve Hobrecht, Los Altos, both of Calif.

[73] Assignee: National Semiconductor Corporation, Santa Clara, Calif.

[21] Appl. No.: 526,463

[22] Filed: Sep. 11, 1995

Related U.S. Application Data

[63] Continuation of Ser. No. 306,657, Sep. 15, 1994, abandoned.
[51] Int. Cl.[6] .................................................. H02M 7/537
[52] U.S. Cl. ........................... 327/102; 327/100; 327/513; 327/362
[58] Field of Search ..................... 327/100, 102, 327/138, 262, 512, 513, 147, 156, 244, 248, 362, 509

[56] References Cited

U.S. PATENT DOCUMENTS 3,614,634 10/1971 Plano et al. .............................. 327/102
4,547,902 10/1985 Kasperkovitz ....................... 455/194.2

Primary Examiner—Timothy P. Callahan
Assistant Examiner—Dinh T. Le
Attorney, Agent, or Firm—Limbach & Limbach

[57] ABSTRACT

A Frequency-to-Voltage Converter (FVC) circuit is based on a precision one-shot that is compensated in a way such that matching of transistors in the circuit is unimportant. Therefore, temperature spacial gradients are rejected. The necessary saturation voltages for the FVC's npn devices are compensated by modulating the drive level of these devices with temperature.

1 Claim, 6 Drawing Sheets

TEMPERATURE-COMPENSATED, PRECISION FREQUENCY-TO-VOLTAGE CONVERTER

This is a continuation of prior complete application Ser. No. 08/306,657 filed on Sep. 15, 1994, and now abandoned, by VICTOR P. SCHRADER ET AL. for TEMPERATURE-COMPENSATED, PRECISION FREQUENCY-TO-VOLTAGE CONVERTER.

BACKGROUND OF THE INVENTION

1. Field of the Invention

The present invention relates to Frequency-to-Voltage Converters (FVC) and, in particular, to a Frequency-to-Voltage Converter based upon a precision, positive-edge-triggered, amplitude-controlled single-shot having a linear frequency-to-voltage transfer characteristic and that is designed for use in video monitor sync-processing and deflection systems.

2. Discussion of the Prior Art

FIG. 1 shows the general architecture of a phase locked loop (PLL) 10 utilizable in a video monitor sync-processing and deflection system for generating a timing signal OUT that is locked to the frequency of an incoming signal IN. PLL 10 includes a Frequency-to-Voltage Converter (FVC) 12 that generates an output voltage $V_{FVC}$ that corresponds to the frequency of the input signal IN. The output voltage $V_{FVC}$ is provided to a summer 14 the output $V_{SUM}$ of which controls the output frequency of a voltage controlled oscillator (VCO) 16.

FIG. 1 shows the input signal IN also provided to a phase detector 18 which generates a phase error output $V_E$ that depends upon the phase difference between the input signal IN and the output signal OUT of the VCO 16. If the phase detector 18 is enabled, then its output $V_E$, filtered by filter 20, is also provided to summer 14 to provide a desired positive or negative correction factor to the output $V_{FVC}$ of the FVC 12 depending, respectively, upon whether the input signal IN lags or leads the output signal OUT. If the phase detector 18 is disabled, then the VCO 16 is driven directly by the output $V_{FVC}$ of the FVC 12.

One class of FVC utilizable in the FIG. 1 circuit 10 relies on a single-shot that, for each cycle of the input signal IN, generates a pulse of constant duration. Thus, at low input frequencies, the pulses of the FVC output signal $V_{FVC}$ are sparse; conversely, when the frequency of the input signal is high, the FVC produces a crowded pulsed output signal $V_{FVC}$. If the output of this single-shot class of FVC is filtered such that the lowpass filter −3dB frequency is much lower than the lowest frequency of interest in the operation of the FVC, then the resultant DC signal provided to the VCO can be shown to be proportional to the input signal frequency.

However, a single-shot class FVC requires a timing circuit that provides very consistent pulse widths. This consistency is very difficult to achieve because of the matching, temperature compensation and base drive requirements of the bipolar devices typically utilized in such circuits.

SUMMARY OF THE INVENTION

The present invention provides a Frequency-to-Voltage Converter (FVC) based on a precision one-shot that is compensated such that matching of devices in the FVC circuit is unimportant; therefore, temperature spacial gradients are rejected. Necessary saturation voltages for the circuit's npn devices are compensated by modulating the drive level with temperature.

A better understanding of the features and advantages of the present invention may be obtained by reference to the following detailed description and the accompanying drawing which set forth an illustrative embodiment in which the principles of the invention are utilized.

DETAILED DESCRIPTION OF THE INVENTION

Figure 1:
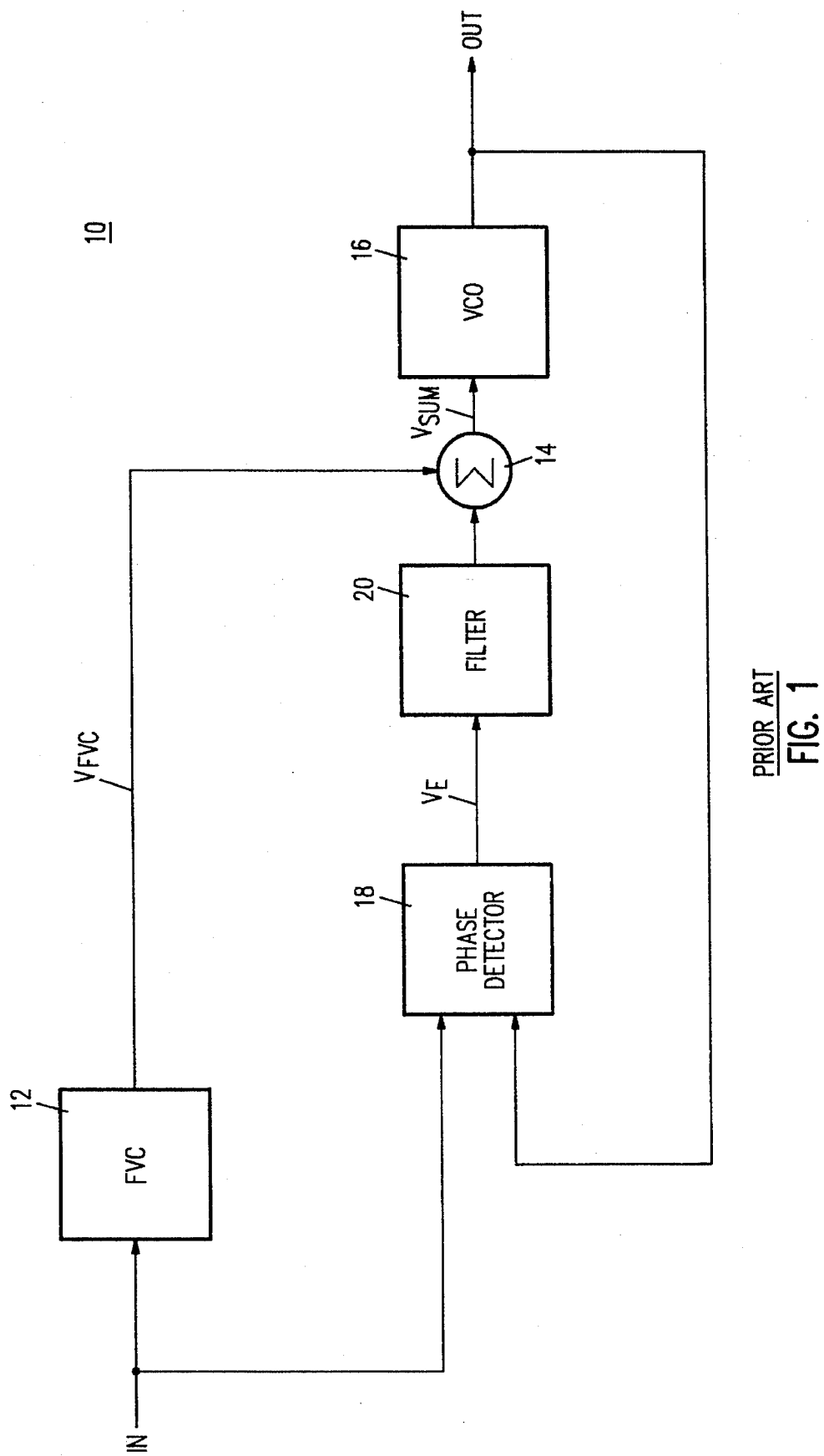
FIG. 1 is a block diagram illustrating a conventional phase locked loop utilizable in video monitor sync-processing and deflection systems.
Figure 2A:
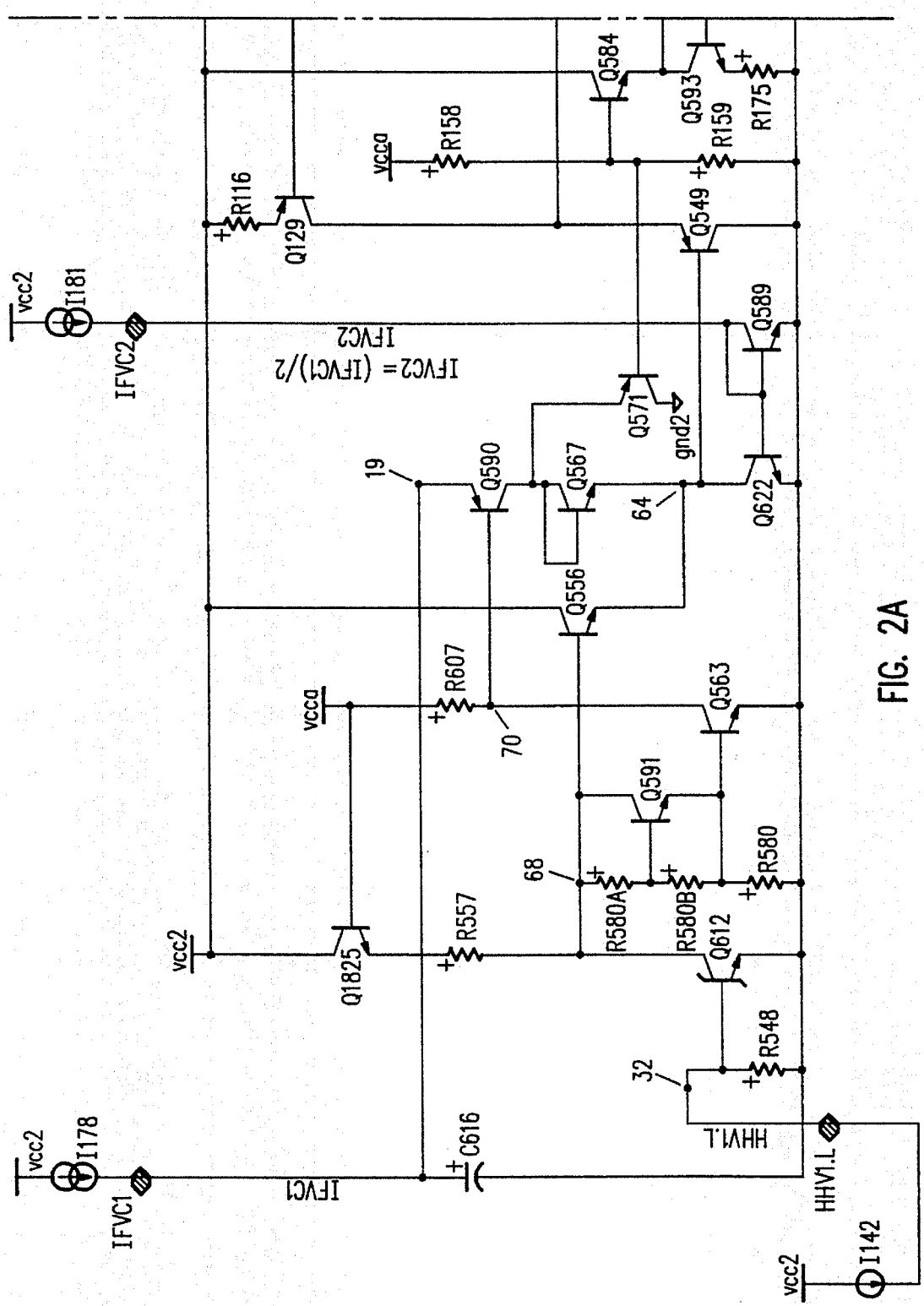
FIGS. 2A–2B are detailed schematic diagram illustrating a circuit embodiment of a Frequency-to-Voltage Converter (FVC) in accordance with the present invention.
Figure 2B:
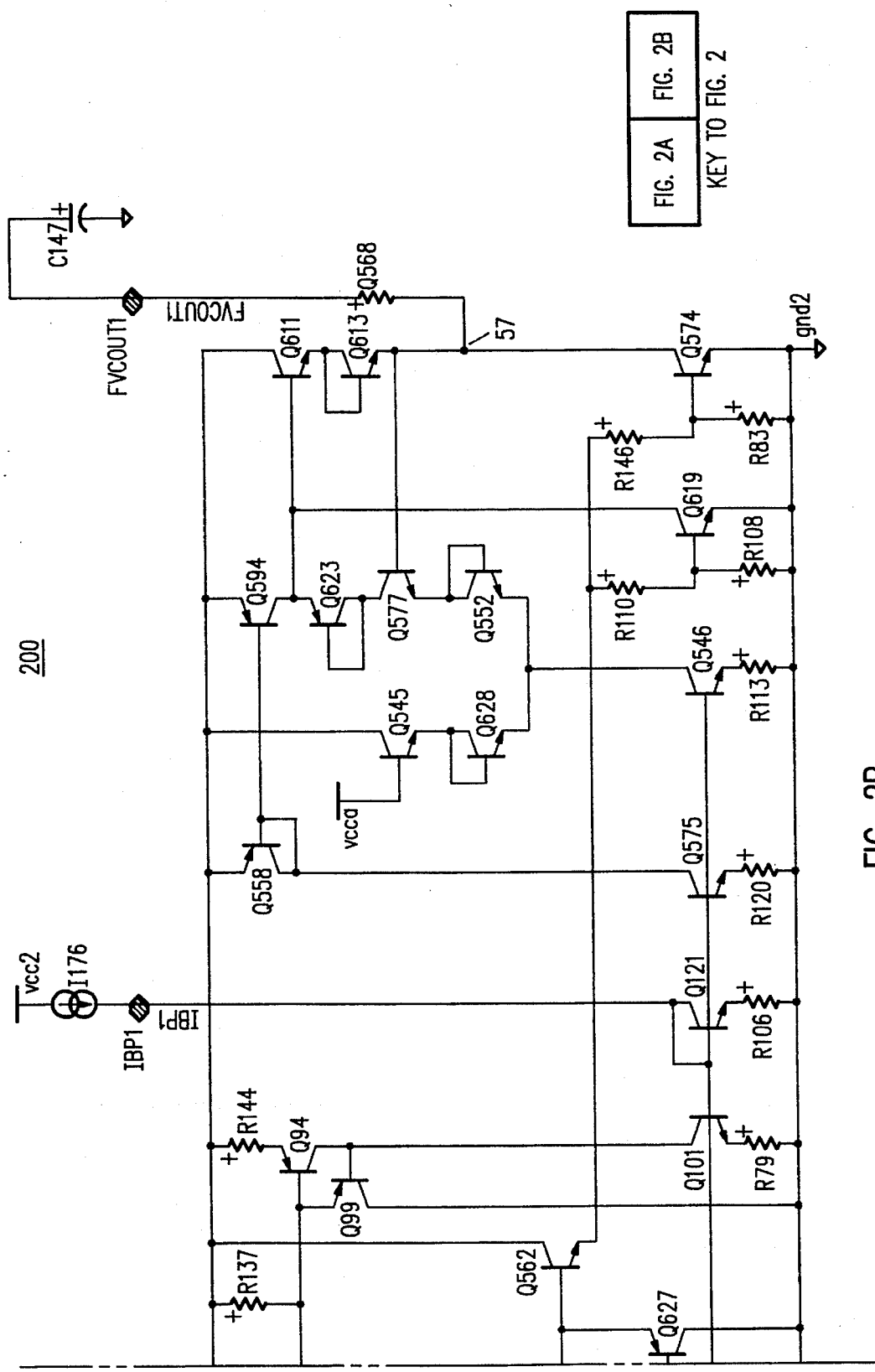

FIGS. 2A–2B shows a Frequency-to-Voltage Converter (FVC) circuit 200 that can be divided into two sections. The triggering and timing of the single-shot are performed in the left hand section of the circuit 200 beginning with the timing capacitor C616. The amplitude of the pulse is set by the right section of the circuit 200, beginning with emitter coupled pair Q545, Q577.

Starting at the input of the circuit 200, note that input HHV1.L is a current mode signal. The required signal is a negative-going pulse train having nominal 100 uA amplitude (source-only), a duty cycle of between 5% and 20%, and frequency between 10–150 kHz. When input signal HHV1.L is off (during a pulse), the collector voltage of npn device Q612 equals 4*Vbe due to voltage division by resistors R580A and R580B and the Vbe of device Q583. Between sync pulses, device Q612 is on and its collector voltage equals ~0.3 V. Thus, the signal on the collector of device Q612 is a positive-going sync pulse.

Between sync pulses, input signal HHV1.L is sourcing current. Therefore, as stated above, device Q612 is on and its collector voltage equals ~0.3 V. Since npn device Q563 is off, the base drive voltage of pnp device Q590 is 8 V. Current IFVC1 charges capacitor C616 until device Q590 turns on at about 8.7 V; then the emitter current of device Q590 equals IFVC1. Since IFVC1=2*IFVC2, npn device Q622 can only sink half of the collector current of device Q590. Therefore, the collector current of device Q567 equals IFVC2. The collector of device Q622 rises until device Q571 turns on. Thus, the collector voltage of device Q590 equals 2.2 V+Vbe. Current IFVC 1 is split equally between transistors Q567 and Q571. The base current of transistor Q590 must flow through resistor R607 to reference voltage supply Vcca; the base voltage of device Q590 actually rises above 8 V during this interval.

At the start of a horizontal sync pulse, input signal HHV1.L stops sourcing current and the collector of device Q612 goes from quasi-saturation to 4*Vbe. Device Q563 is turned on and, in fact, goes into saturation very quickly, discharging capacitor C616 through the base of device Q590, which remains saturated during and after the discharge of capacitor C616.

At the same time, transistors Q556 and Q591 turn on, pulling the collector voltage of device Q622 to 3 Vbe. Current IFVC1 then flows out of the base of transistor Q590, which is still saturated, and into the saturated collector of transistor Q563. Thus, the voltage of capacitor C616 quickly moves from 8.7 V to 0.7 V and remains at that level during the sync pulse.

Note that, until this time in the operation of the circuit 200, the collector voltage of device Q622 has been at about 3 Vbe: before the sync pulse, it equalled ~2.2 V, and during the sync pulse it equalled 3 Vbe. As discussed below, this node goes to ground (sat) momentarily after the sync pulse ends; this is the information that allows production of a single-shot output pulse.

At the trailing edge of the horizontal sync pulse, input signal HHV1.L starts sourcing current once again. The collector voltage of device Q622 returns to 0.3 V and device Q563 turns off so that the base voltage of device Q590 immediately rises to 8 V. Device Q590 turns off and current IFVC1 begins charging capacitor C616 from 0.7 V. Since the collector of device Q612 is low, the collector of device Q622 is no longer being held up by device Q556; since no current is entering the Q622 collector node, the collector voltage of device Q622 equals Vce_sat. This represents the START of the output pulse.

When the capacitor C616 has charged to ~8.7 V, device Q590 turns on and the collector current of device Q590 equals IFVC1. Since IFVC1=2*IFVC2, current IFVC1 quickly dominates and pulls the collector voltage of device Q622 up until clamp device Q571 turns on and the collector voltage of device Q622 equals ~2.2 V. This represents the END of the output pulse.

Thus, the signal at the collector of device Q622 is a waveform which rests at 2.2 V between sync pulses, equals 2 Vbe during sync, and equals Vce_sat from just after the trailing edge of sync until the capacitor C616 is fully charged, when it returns to 2.2 V at the next sync pulse. This signal then is applied to a vertical pnp emitter follower Q549, a 2.2 V clamp (devices Q584, Q627) and an npn emitter follower Q562. At the emitter of device Q562, the signal is now a cleaned up, negative-going pulse that rests at 2.2 V-Vbe before and during sync. The (Vce_sat) pulse starts just after the sync trailing edge and ends when the capacitor C616 has charged.

The 8 V voltage clamp includes the npn emitter coupled pair Q545 and Q577. In its resting state (between output pulses), the base voltage of device Q611 equals Vce_sat and, at the output pulse node, the collector voltage of device Q574 equals Vce_sat. During an output pulse, npn devices Q619 and Q574 are off. The feedback amplifier (which comprises the devices to the right of device Q575 in FIG. 2, except devices Q619 and Q574 and associated resistors) is active and keeps the output node at the collector of device Q574 equal to 8 V, where the 8 V input to device Q545 is provided by a bandgap reference external to the circuit 200 under consideration.

Experiments with an integrated circuit realization, as well as simulation, of the above-described FVC 200 have shown its temperature coefficient to be less than 20 ppm/degrees Celsius over the temperature range 0–85 degrees C. The design techniques utilized to achieve this performance are described below. Note that the die layout for the above-described circuit 200 uses no cross-coupling, common-centroid or other rigorous device matching methods.

The most important and fundamental technique is the use of a single transistor, pnp Q590, which sets both of the pulse-time-controlling integration thresholds. The Vbe of device Q590 is added to both the thresholds, rendering device matching considerations irrelevant. During the integration, transistor Q590 is off, and there are no transistor bases attached to the integration node; thus, changes in beta do not affect the integration.

One-shot FVCs typically exhibit nonlinearity resulting from reduced pulsewidth at higher frequencies. This is due to incomplete resetting of the capacitor voltage between pulses. In accordance with the invention, the 18 pF capacitor C616 discharges through the base of lateral pnp Q590 and the collector of npn Q563. The naturally low base resistance of the lateral pnp Q590, and conventional layout measures taken for low npn collector resistance, result in a discharge RC time constant no longer than 20 ns. Since the shortest available discharge time is 500 ns, the capacitor C616 is always discharged to a level corresponding to at least 25 time constants—an error of 14E-12, or 14 ppt (parts per trillion).

The saturation voltages of transistors Q563 and Q574 are crucial in assuring low drift. Note that these two saturation voltages cancel first order, since a nonzero saturation voltage produces, for transistor Q563, a narrowed output pulse resulting in lowered DC output, and, for transistor Q574, a higher DC output. Using empirical data for saturation voltage versus temperature, current, and forced beta, the base drive for both these devices (Q563, Q574) is designed to have a strong positive temperature coefficient. For example, the base drive current for transistor Q563 is set by the current of resistor 20k R557. The voltage across resistor R557, when transistor Q563 is on, is 8 V-5 Vbe. Similarly, the base drive current in transistor Q574 is set by 1.7 k resistor R146, the voltage across which is 2.2 V-2 Vbe.

Figure 3A:
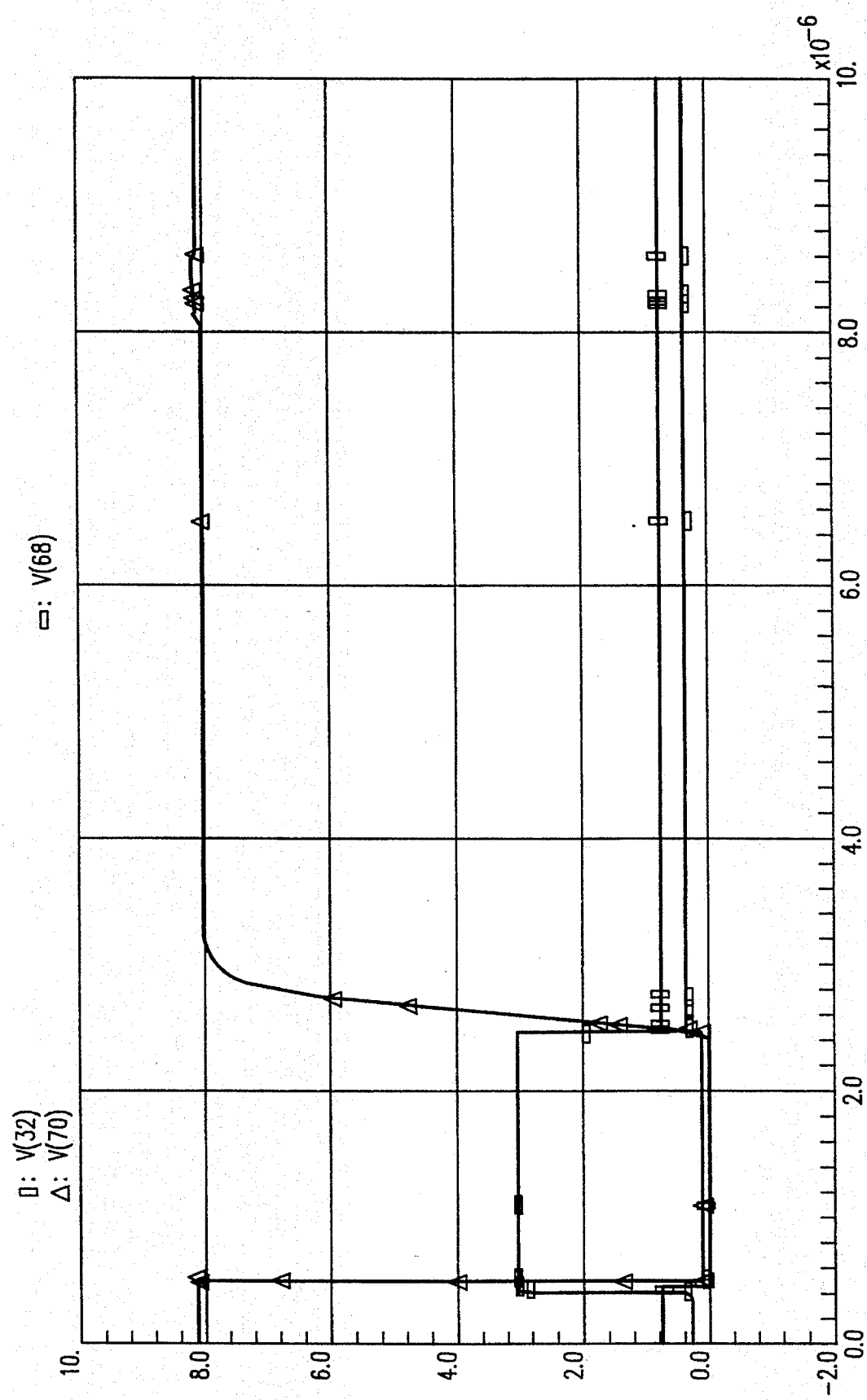
FIGS. 3A–3C are simulation diagrams illustrating the waveforms of the signals at six nodes identified in the FIGS. 2A–2B circuits.
Figure 3B:
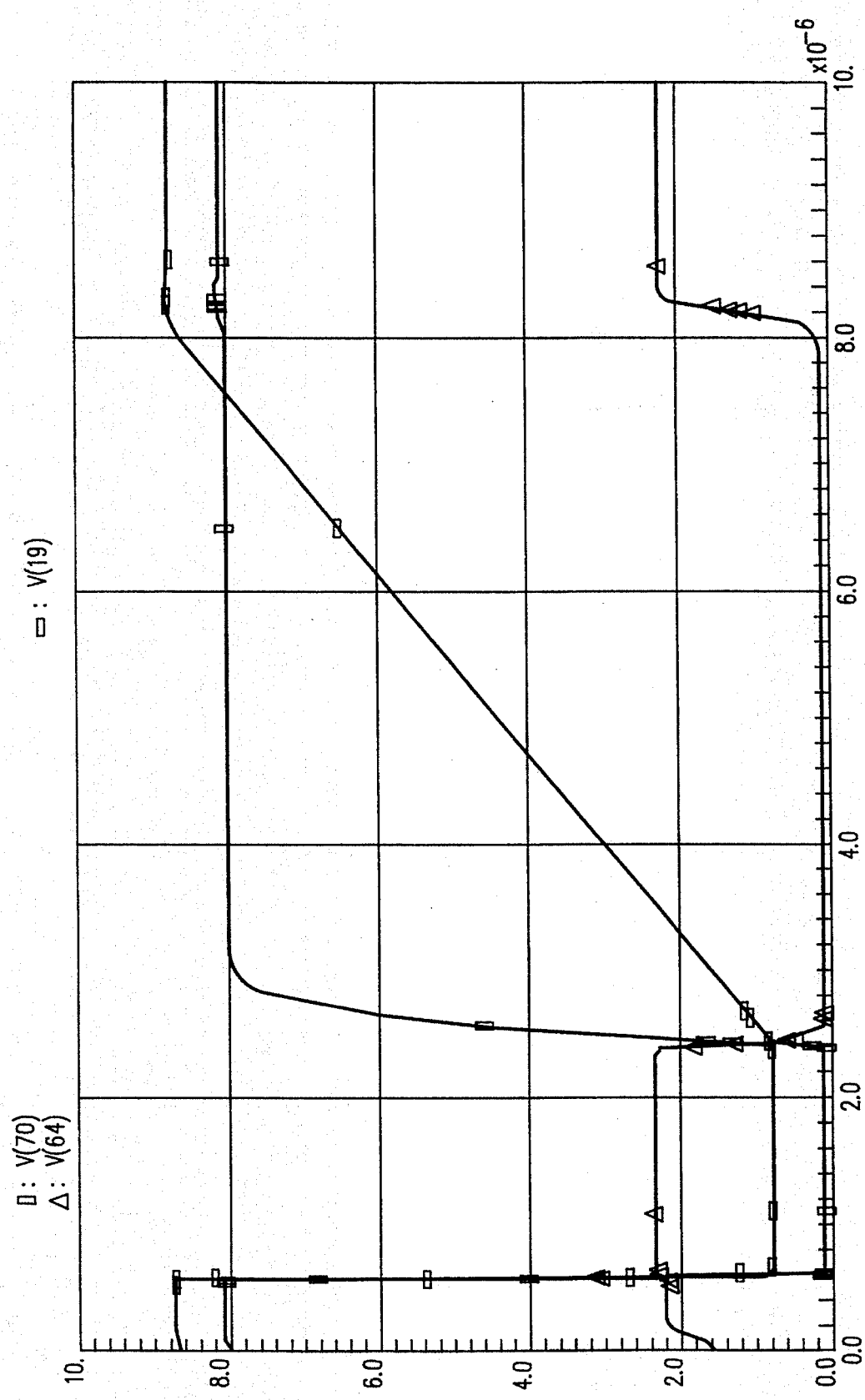
Figure 3C:
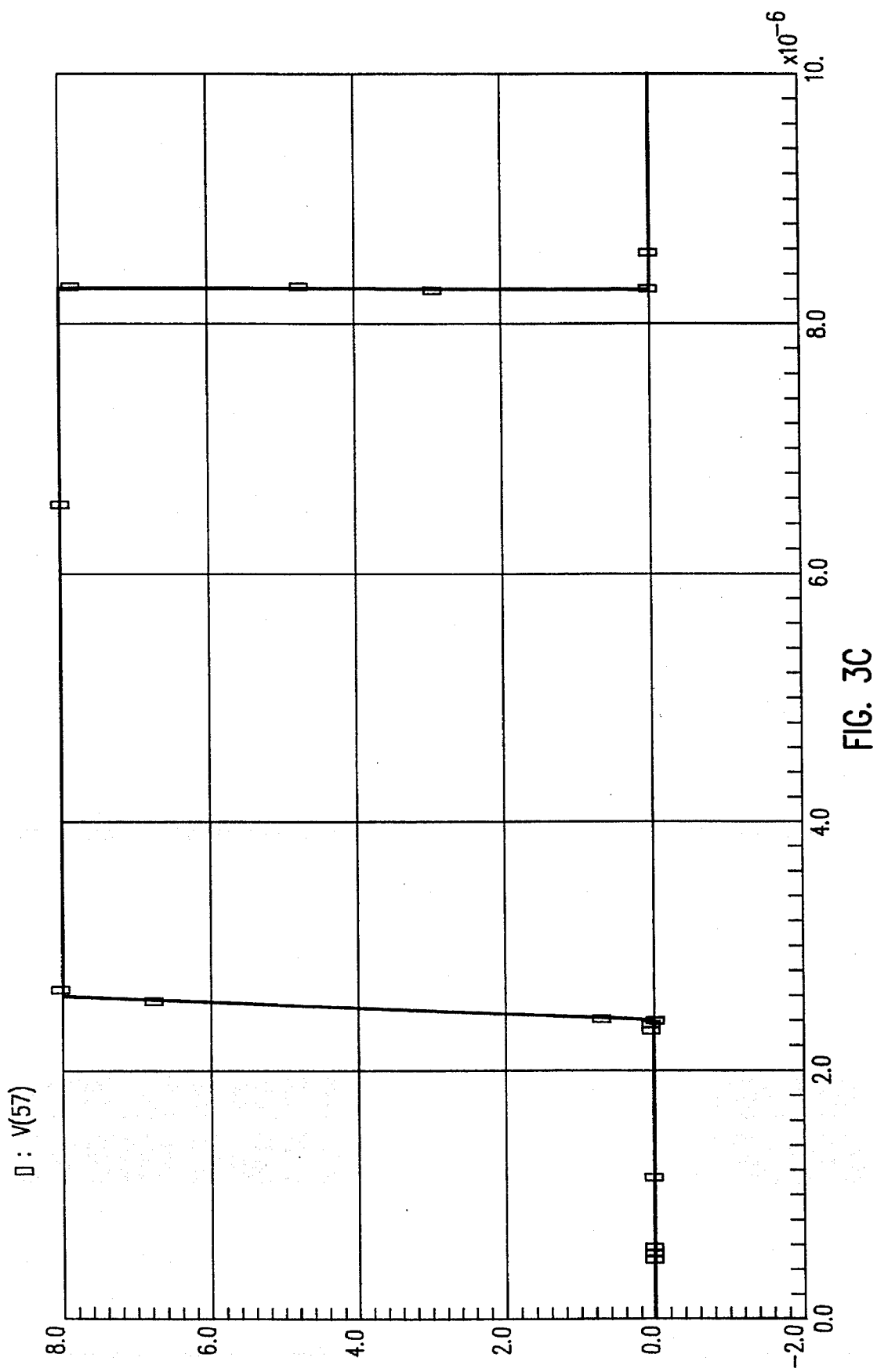

The simulation waveforms of the signals at nodes 19, 32, 57, 64, 68 and 70 of the FIG. 2A–2B circuit 20 are shown in the FIG. 3A–FIG. 3C diagrams to further illustrate the operation of the FIG. 2A–2B circuit 200.

It should be understood that various alternatives to the embodiments of the invention described herein may be employed in practicing the invention. For example, those skilled in the art will appreciate that the polarity of the FIG. 2A–2B circuit 200 may be reversed while still achieving the desired results. It is intended that the following claims define the scope of the invention and that structures and methods within the scope of the claims and their equivalents be covered thereby.

What is claimed is:

1. A temperature-compensated, precision frequency-to-voltage converter circuit that, for each cycle of an input signal to he converter circuit, provides a voltage pulse of constant duration, the converter circuit comprising:

a first npn transistor having its base connected to receive a pulsed, current mode input signal and its emitter connected to a negative power supply, the base of the first npn transistor also being connected to the negative supply via a first resistor;

a timing capacitor having first and second plates, the second plate being connected to the negative supply;

a first constant current source connected between a positive supply and the first plate of the capacitor for providing a first current;

a second npn transistor having its base connected to the collector of the first npn transistor and its collector connected to the positive supply;

a third npn transistor having its base connected to a reference supply its collector connected to the positive supply and its emitter coupled to the collector of the first npn transistor via a second resistor;

third, fourth and fifth series-connected resistors connected between the collector of the first npn transistor and the negative supply;

a fourth npn transistor having its base connected between the fourth and fifth resistor, its collector coupled to the reference supply via a sixth resistor, and its emitter connected to the negative supply;

a fifth npn transistor having its base connected between the third and fourth resistors, its collector connected to the base of the second npn transistor and its emitter connected to the base of the fourth npn transistor;

a first pnp transistor having its emitter connected between the first current supply and the first plate of the timing capacitor and its base connected to the collector of the fourth npn transistor;

a sixth npn transistor having its commonly-connected base and collector connected to the collector of the collector of the first pnp transistor;

a seventh npn transistor having its collector connected to the emitter of the second npn transistor and to the emitter of the sixth npn transistor and its emitter connected to the negative supply;

an eighth npn transistor having its base commonly-connected to its collector and to the base of the seventh npn transistor and its emitter connected to the negative supply;

a second current source connected between the positive supply and the commonly-connected bases of the seventh and eighth npn transistors for providing a second current;

a second pnp transistor having its emitter connected to the collector of the first pnp transistor, its collector connected to the negative supply, and its base connected to the positive supply via a sixth resistor and to the negative supply via a seventh resistor;

a third pnp transistor having its base connected to the commonly-connected emitters of the second npn transistor and the sixth npn transistor and its collector connected to the negative supply;

a fourth pnp transistor having its collector connected to the emitter of the third pnp transistor, its emitter coupled to the positive supply via an eighth resistor, and its base coupled to the positive supply via a ninth resistor;

a ninth npn transistor having its base coupled between the sixth and seventh resistors and its collector coupled to the positive supply;

a tenth npn transistor having its collector coupled to the emitter of the ninth npn transistor and its emitter coupled to the negative supply via a tenth resistor;

a fifth pnp transistor having its base connected to the emitter of the ninth npn transistor, its emitter connected to the collector of the fourth pnp transistor and its collector connected to the negative supply;

an eleventh npn transistor having its base connected to the emitter of the fifth pnp transistor and its collector connected to the positive supply;

a sixth pnp transistor having its emitter coupled to the positive supply via the ninth resistor and its collector connected to the negative supply;

a seventh pnp transistor having its base connected to the emitter of the sixth pnp transistor, its emitter coupled to the positive supply via an eleventh resistor, and its collector connected to the base of the sixth pnp transistor;

a twelfth npn transistor having its base connected to the base of the tenth npn transistor, its collector connected to the collector of the seventh pnp transistor and its emitter coupled to the negative supply via a twelfth resistor;

a thirteenth npn transistor having its base connected to the base of the twelfth npn transistor and its emitter coupled to the negative supply via a thirteenth resistor;

a third current source coupled between the positive supply and the collector of the thirteenth npn transistor, for providing a third current, the collector of the thirteenth npn transistor being connected to its base;

a fourteenth npn transistor having its base connected to the base of the thirteenth npn transistor and its emitter coupled to the negative supply via a fourteenth resistor;

a feed back amplifier coupled to the collector of the fourteenth npn transistor;

a fifteenth npn transistor having its base coupled to the emitter of the eleventh npn transistor via a fifteenth resistor and to the negative supply via a sixteenth resistor, its emitter connected to the negative supply, and its collector connected to an output of the feedback amplifier;

a sixteenth npn transistor having its base connected to the output of the feedback amplifier and its collector connected to the positive supply;

a seventeenth npn transistor having its commonly-connected base and collector connected to the emitter of the sixteenth npn transistor and its emitter connected to an input of the feedback amplifier and to an output node of the converter circuit;

an eighteenth npn transistor having its base connected to the emitter of the eleventh npn transistor and coupled to the negative supply via sixteenth resistor, its collector connected to the output node and its emitter connected to the negative supply.

\* \* \* \* \*

UNITED STATES PATENT AND TRADEMARK OFFICE
CERTIFICATE OF CORRECTION

PATENT NO. : 5,514,988
DATED : May 7, 1996
INVENTOR(S) : Victor P. Schrader, Steve Hobrecht It is certified that error appears in the above-indentified patent and that said Letters Patent is hereby corrected as shown below:

In Col. 4, line 50, after "to" delete "he" and replace with --the--.

Signed and Sealed this

Thirteenth Day of August, 1996

Attest:

BRUCE LEHMAN

Attesting Officer      Commissioner of Patents and Trademarks